(12) United States Patent
Kawata et al.

(10) Patent No.: US 9,048,453 B2
(45) Date of Patent: Jun. 2, 2015

(54) LIGHT-EMITTING DEVICE

(71) Applicants: Takuya Kawata, Kanagawa (JP); Hisao Ikeda, Kanagawa (JP); Manabu Niboshi, Osaka (JP); Seiichi Mitsui, Osaka (JP); Yoshitaka Yamamoto, Osaka (JP)

(72) Inventors: Takuya Kawata, Kanagawa (JP); Hisao Ikeda, Kanagawa (JP); Manabu Niboshi, Osaka (JP); Seiichi Mitsui, Osaka (JP); Yoshitaka Yamamoto, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 0 days.

(21) Appl. No.: 13/627,205

(22) Filed: Sep. 26, 2012

(65) Prior Publication Data

US 2013/0082247 A1    Apr. 4, 2013

(30) Foreign Application Priority Data

Sep. 29, 2011   (JP) ................................. 2011-214826

(51) Int. Cl.
 *H01L 51/52*   (2006.01)
(52) U.S. Cl.
 CPC ......... *H01L 51/5209* (2013.01); *H01L 51/5278* (2013.01); *H01L 51/5275* (2013.01)
(58) Field of Classification Search
 USPC .................. 257/40, 98–100; 313/72, 504
 See application file for complete search history.

(56) References Cited

U.S. PATENT DOCUMENTS

| | | | |
|---|---|---|---|
| 6,433,487 B1 | 8/2002 | Yamazaki | |
| 6,555,969 B2 * | 4/2003 | Yamazaki | .................. 315/169.3 |
| 6,833,667 B2 * | 12/2004 | Hamano et al. | ................ 313/504 |
| 7,012,300 B2 | 3/2006 | Yamazaki | |
| 7,223,146 B2 | 5/2007 | Nishikawa | |
| 7,427,834 B2 | 9/2008 | Yamazaki | |
| 7,710,028 B2 | 5/2010 | Yamazaki | |
| 8,198,806 B2 | 6/2012 | Yamazaki | |

(Continued)

FOREIGN PATENT DOCUMENTS

| | | |
|---|---|---|
| JP | 9-115667 | 5/1997 |
| JP | 2001-143874 | 5/2001 |

(Continued)

OTHER PUBLICATIONS

International Search Report for WO application PCT/JP2012/074999, mailing date Oct. 30, 2012.

(Continued)

*Primary Examiner* — Cheung Lee
*Assistant Examiner* — Frederick B Hargrove
(74) *Attorney, Agent, or Firm* — Husch Blackwell LLP

(57) ABSTRACT

To provide a light-emitting device which can emit bright light without increasing the projected area of a light-emitting element and be manufactured with high yield. A light-emitting device of one embodiment of the present invention includes a plurality of projections; a first electrode formed along the plurality of projections; a layer containing a light-emitting organic compound formed along the plurality of projections and over the first electrode; and a second electrode formed along the plurality of projections and over the layer containing a light-emitting organic compound. Further, the plurality of projections each have a bottom surface having a side in contact with a bottom surface of an adjacent projection; a plurality of side surfaces each having a certain angle greater than 0° and less than or equal to 80° with respect to the bottom surface; and a vertex having a first continuously curved surface.

20 Claims, 6 Drawing Sheets

(56) References Cited

U.S. PATENT DOCUMENTS

| | | | |
|---|---|---|---|
| 2007/0200491 A1* | 8/2007 | Seo et al. | 313/504 |
| 2010/0051973 A1* | 3/2010 | Kobayashi et al. | 257/88 |
| 2010/0194275 A1* | 8/2010 | Yamazaki | 315/72 |
| 2011/0121276 A1* | 5/2011 | Hayashi | 257/40 |
| 2011/0291087 A1* | 12/2011 | Harada et al. | 257/40 |
| 2012/0168787 A1* | 7/2012 | Okumoto et al. | 257/89 |
| 2012/0211739 A1 | 8/2012 | Koyama et al. | |

FOREIGN PATENT DOCUMENTS

| | | |
|---|---|---|
| JP | 2003-257661 | 9/2003 |
| JP | 2003-257662 | 9/2003 |
| JP | 2006-351211 | 12/2006 |
| JP | 2009-059666 A | 3/2009 |
| WO | WO 2008/126269 A1 | 10/2008 |
| WO | WO 2011/052468 A1 | 5/2011 |

OTHER PUBLICATIONS

Written Opinion of the International Searching Authority for WO application PCT/JP2012/074999, mailing date Oct. 30, 2012.

* cited by examiner

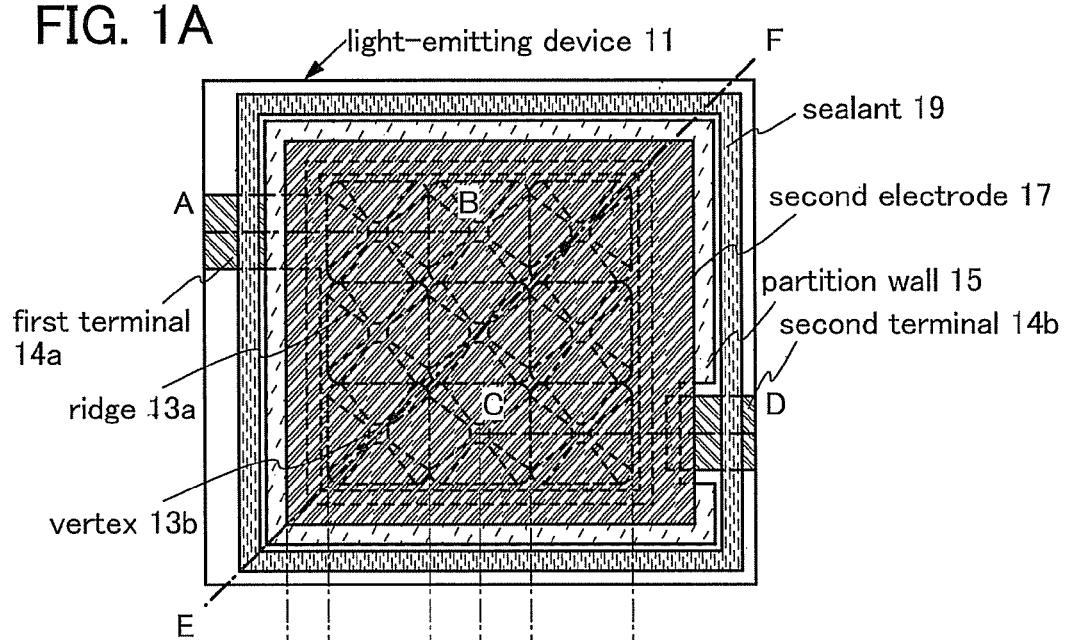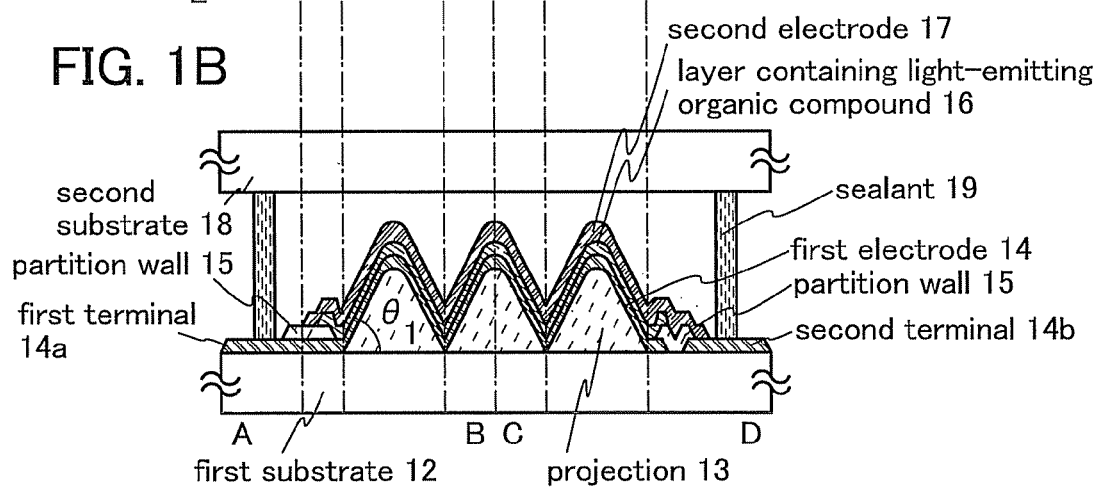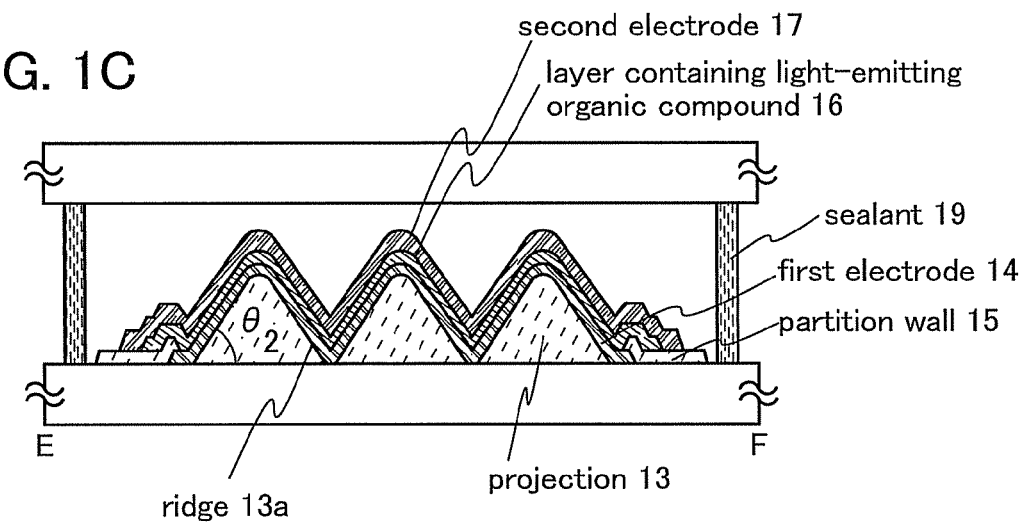

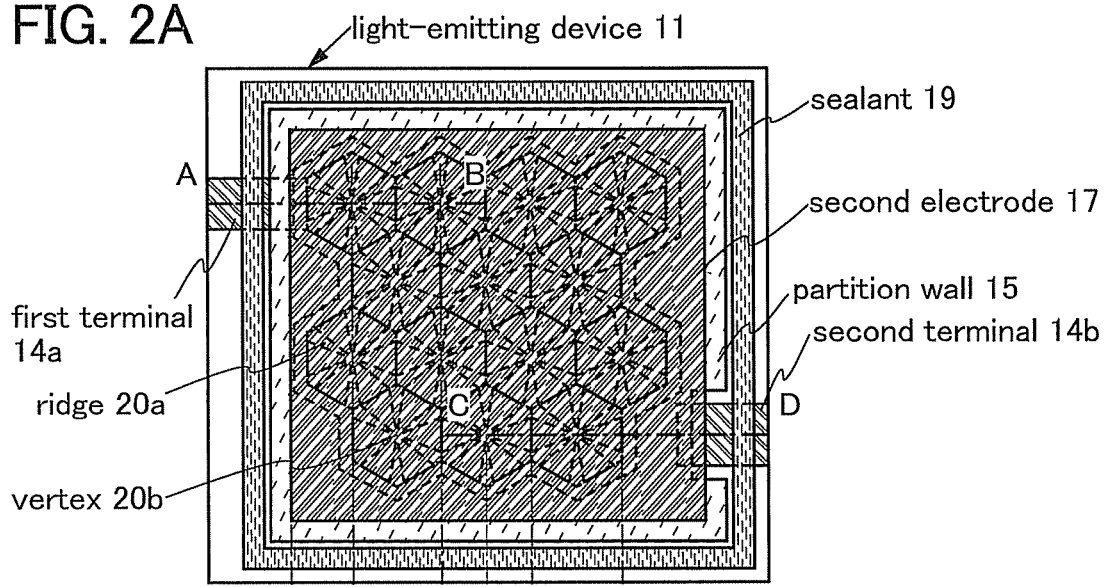
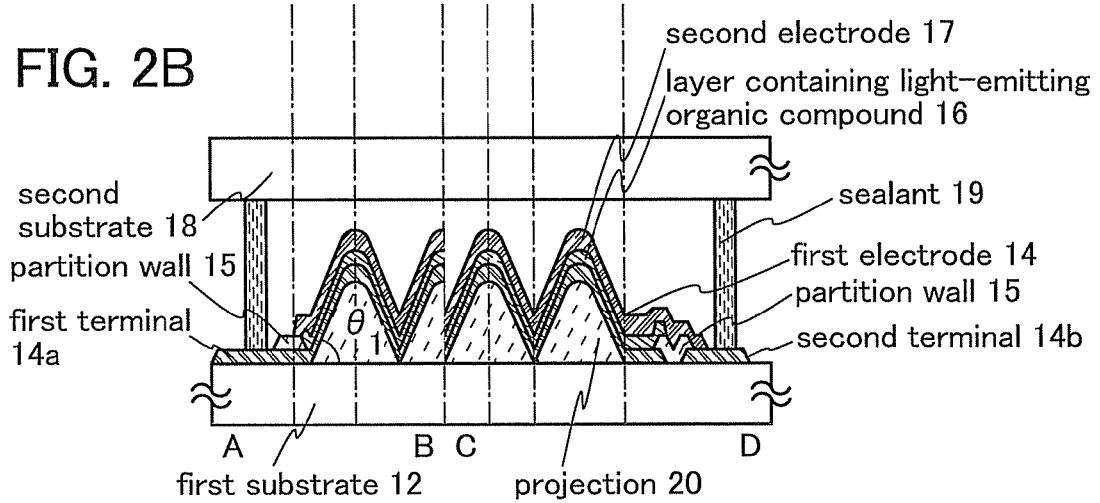

FIG. 3A
Uneven structure having projections each having quadrangular bottom surface
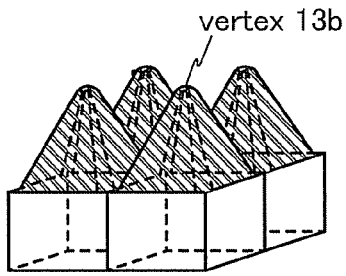
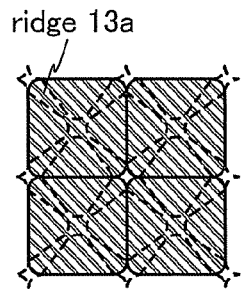
FIG. 3B
Uneven structure having projections each having hexagonal bottom surface
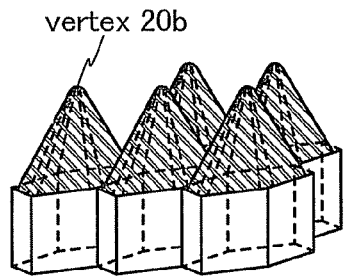
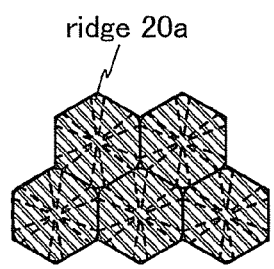
FIG. 3C
Comparative example
Uneven structure having projections (circular cones) each having circular bottom surface
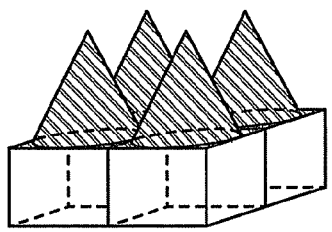
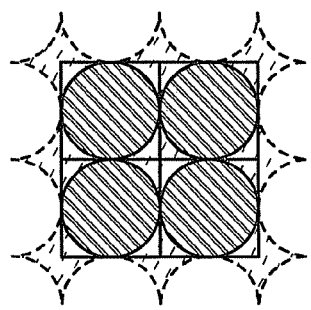

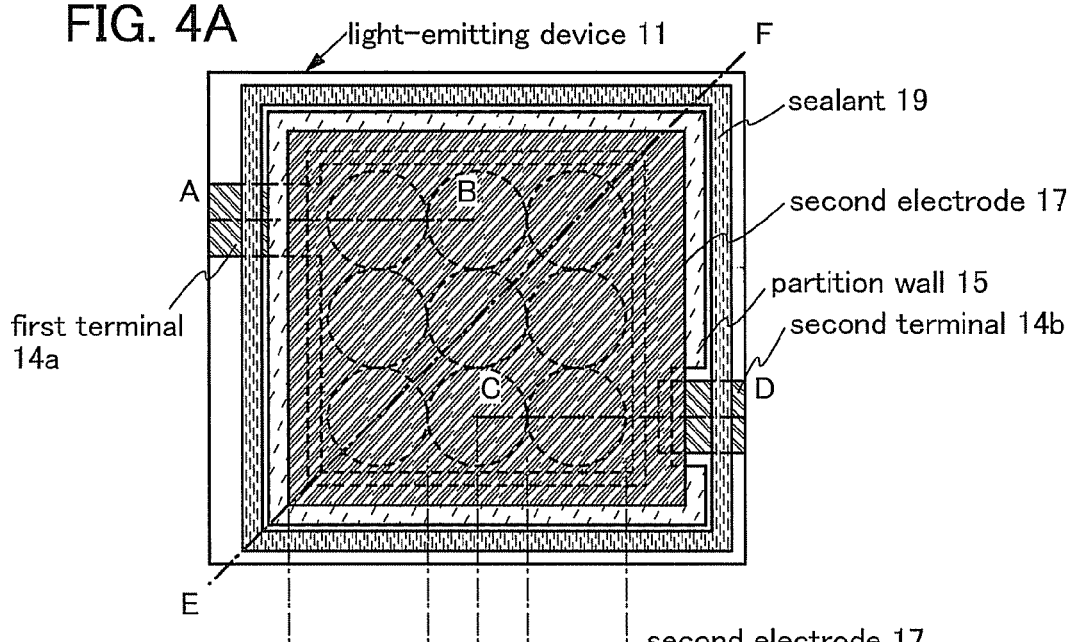
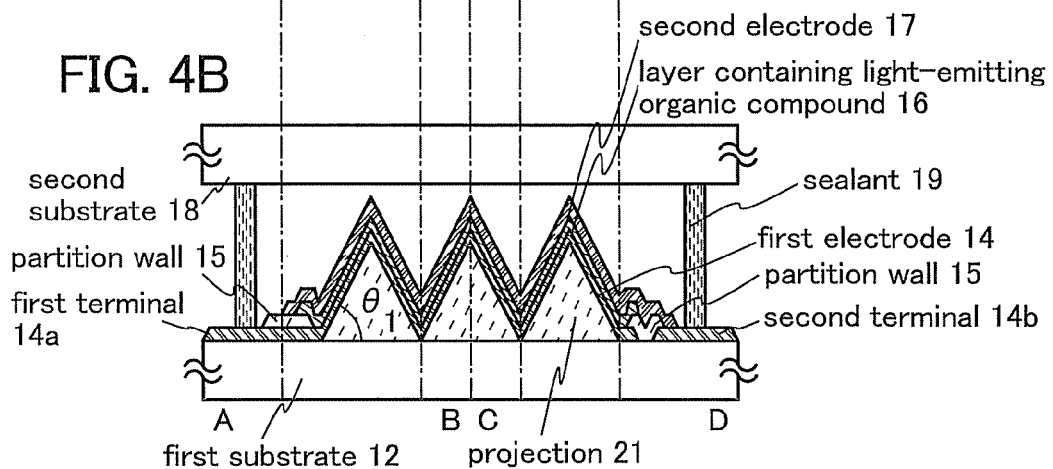
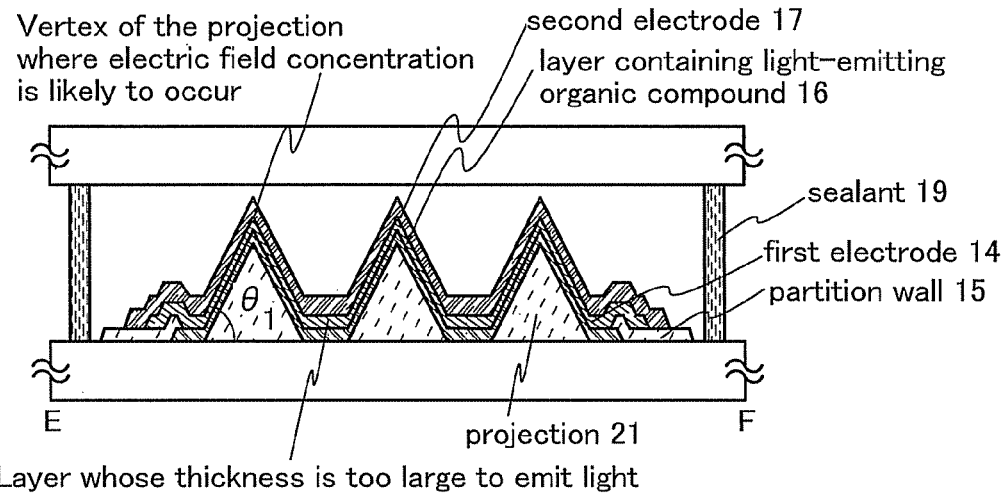

LIGHT-EMITTING DEVICE

TECHNICAL FIELD

The present invention relates to a light-emitting device which includes a layer containing a light-emitting organic compound (also referred to as an EL layer), between a first electrode and a second electrode.

BACKGROUND ART

In Patent Document 1, a light-emitting element formed over an uneven structure is disclosed. Specifically, an uneven structure is formed over a substrate and a light-emitting element which includes a layer containing a light-emitting organic compound, between a first electrode and a second electrode, is formed along the uneven structure, whereby the area of the light-emitting element (that is, a light emission area) can be made larger than the area of the substrate provided with the uneven structure (that is, the projected area of the light-emitting element). Thus, the brightness of the light-emitting element can be increased. Accordingly, even when the luminance in a light-emitting portion of the light-emitting element is low, the effective luminance of the light-emitting element can be kept at a practical level.

REFERENCE

Patent Document

[Patent Document 1] Japanese Published Patent Application No. 2003-257661 (paragraphs 0037 to 0040)

DISCLOSURE OF INVENTION

However, when the layer containing the light-emitting organic compound is formed over the projection of the uneven structure so that the layer has an appropriate thickness over a side surface of the projection of the uneven structure, the thickness of the layer containing the light-emitting organic compound may be too large between the projections (see FIG. 4C). As a result, a defect that a region between the projections does not emit light or a defect that the emission intensity decreases occurs. Further, electric field concentration is likely to occur at the vertex of the projection, and it is difficult to cover the vertex of the projection with the layer containing the light-emitting organic compound densely; therefore, a defect that the first electrode and the second electrode are short-circuited at the vertex during driving is likely to occur.

It is an object of one embodiment of the present invention to provide a light-emitting device which can emit bright light without increasing the projected area of a light-emitting element and can be manufactured with high yield. It is another object of one embodiment of the present invention to provide a light-emitting device which can emit bright light without increasing the projected area of a light-emitting element and in which uniform light emission can be obtained.

One embodiment of the present invention focuses on the vertex of a projection of an uneven structure and the arrangement of a plurality of projections, specifically, an uneven structure in which the projections are provided so that a side of the bottom surface of the projection and a side of the bottom surface of the adjacent projection are in contact with each other and the projections each have a vertex having a continuously curved surface.

One embodiment of the present invention is a light-emitting device including a plurality of projections; a first electrode formed along the plurality of projections; a layer containing a light-emitting organic compound which is formed along the plurality of projections and over the first electrode; and a second electrode formed along the plurality of projections and over the layer containing the light-emitting organic compound. Further, the plurality of projections each have a bottom surface having a side in contact with a bottom surface of an adjacent projection; a plurality of side surfaces each having a certain angle greater than 0° and less than or equal to 80° with respect to the bottom surface; and a vertex having a first continuously curved surface.

According to one embodiment of the present invention, each of a plurality of projections has a plurality of side surfaces each having a certain angle greater than 0° and less than or equal to 80° with respect to the bottom surface, whereby a layer containing a light-emitting organic compound can be formed over the first electrode to a uniform thickness when the layer containing the light-emitting organic compound is formed from the direction perpendicular to the bottom surface. Further, the projections are provided so that sides of the bottom surfaces of the adjacent projections are in contact with each other, and thus, the area of a region between the projections is reduced. Accordingly, a light-emitting device in which a region which does not emit light or a region having low emission intensity is reduced and in which uniform light emission is obtained can be provided. Moreover, each of the plurality of projections has a bottom surface having a side in contact with a bottom surface of an adjacent projection, whereby as many side surfaces each having a certain angle as possible can be provided, and an area which emits light with high uniformity is increased, so that a light-emitting device which emits bright light with high uniformity can be provided. Furthermore, when the vertex of the projection has a first continuously curved surface, the first electrode and the second electrode are unlikely to be short-circuited, so that a highly reliable light-emitting device can be manufactured with high yield.

According to one embodiment of the present invention, a total area of the plurality of side surfaces and second continuously curved surfaces in the projection is larger than the area of the side surface of a circular cone which is provided on an inner side than the bottom surface of the projection and whose bottom surface has a shape of a circle in contact with sides of the bottom surface of the projection. Thus, the projections can be arranged without any space in a limited projected area, and an effect of increasing the light emission area can be large as compared to a light-emitting device having circular cones. Here, "a circular cone" means a solid surrounded by the bottom surface and lines (generatrices) each connecting a point on the circumference of a circle (the bottom surface) on a plane to one point which does not exist on the plane.

Further, in one embodiment of the present invention, the projection is preferably a pyramid. Here, "a pyramid" means a polyhedron surrounded by the bottom surface and lines (generatrices) each connecting a point on sides of a polygon (the bottom surface) on a plane to one point which does not exist on the plane.

Moreover, in one embodiment of the present invention, the bottom surface preferably has a hexagonal shape. When the bottom surface has a hexagonal shape, the projections can be arranged without any space in a limited projected area, so that more projections can be arranged. Further, the projection has a structure in which two side surfaces are in contact with each other on a ridge of the projection at an obtuse angle, so that a light-emitting device in which the first electrode and the second electrode are unlikely to be short-circuited on the ridge can be provided.

Furthermore, in one embodiment of the present invention, the plurality of side surfaces are preferably connected to each other with the second continuously curved surface. Thus, the projection has a structure in which two side surfaces are in contact with each other with the second continuously curved surface on a ridge of the projection, so that a light-emitting device in which the first electrode and the second electrode are unlikely to be short-circuited on the ridge can be provided.

Further, in one embodiment of the present invention, a light-emitting device may include an auxiliary electrode which is formed at the feet of the plurality of projections and electrically connected to the first electrode. Thus, even when the surface area of the first electrode provided over the projections is increased and the electric resistance of the first electrode is high, the effective electric resistance of the first electrode can be reduced by the auxiliary electrode, so that uniform light emission can be obtained.

Furthermore, in one embodiment of the present invention, an end of the auxiliary electrode is preferably covered with the projection. When the end of the auxiliary electrode is covered with the projection, a defect of a short circuit between the first electrode and the second electrode which may be caused by a step at the end of the auxiliary electrode in the case where the auxiliary electrode is provided between the projection and the first electrode can be prevented.

According to one embodiment of the present invention, a light-emitting device which can emit bright light without increasing the projected area of a light-emitting element and can be manufactured with high yield can be provided. Further, according to one embodiment of the present invention, a light-emitting device which can emit bright light without increasing the projected area of a light-emitting element and in which uniform light emission can be obtained can be provided.

BRIEF DESCRIPTION OF DRAWINGS

In the accompanying drawings:

FIG. 1A is a plan view illustrating a light-emitting device of one embodiment of the present invention, FIG. 1B is a cross-sectional view taken along line A-B and line C-D of FIG. 1A, and FIG. 1C is a cross-sectional view taken along line E-F of FIG. 1A;

FIG. 2A is a plan view illustrating a light-emitting device of one embodiment of the present invention, and FIG. 2B is a cross-sectional view taken along line A-B and line C-D of FIG. 2A;

FIG. 3A is a perspective view and a plan view illustrating some of projections 13 and part of a first substrate 12 which are illustrated in FIGS. 1A to 1C, FIG. 3B is a perspective view and a plan view illustrating some of projections 20 and part of a first substrate 12 which are illustrated in FIGS. 2A and 2B, and FIG. 3C is a perspective view and a plan view illustrating some of projections and part of a first substrate as a comparative example;

FIG. 4A is a plan view illustrating a light-emitting device of the comparative example in which the area of a region between the projections is large, FIG. 4B is a cross-sectional view taken along line A-B and line C-D of FIG. 4A, and FIG. 4C is a cross-sectional view taken along line E-F of FIG. 4A;

BEST MODE FOR CARRYING OUT THE INVENTION

Figure 5A:
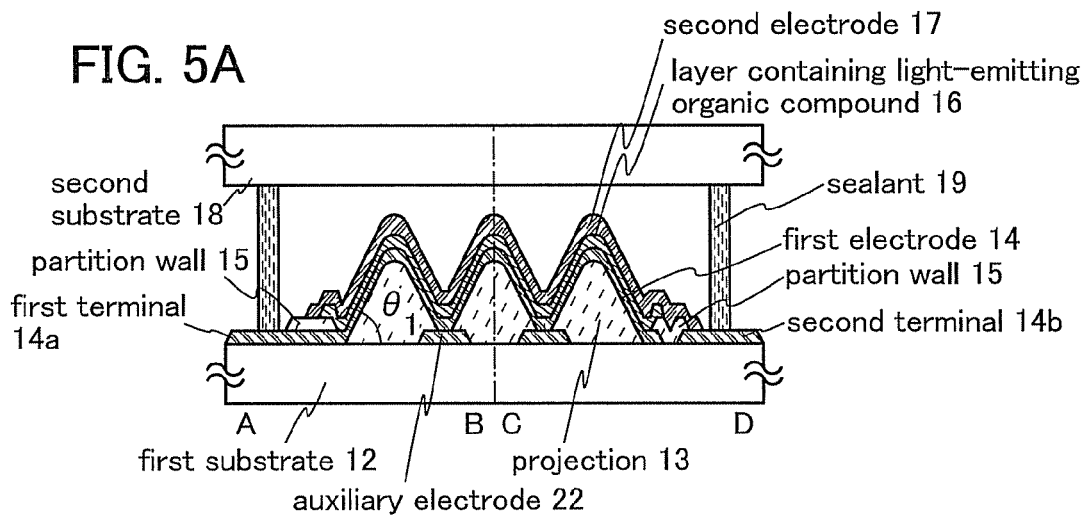
FIG. 5A is a cross-sectional view taken along line A-B and line C-D of FIG. 1A illustrating a light-emitting device of one embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

[Embodiment 1]

A light-emitting device of one embodiment of the present invention will be described with reference to FIGS. 1A to 1C and FIG. 3A. As illustrated in FIGS. 1A to 1C, a light-emitting device 11 includes the first substrate 12.

As the first substrate 12, a transparent or translucent substrate can be used. In the case where light of a light-emitting element is extracted from a surface on a side opposite to the first substrate 12, an opaque substrate can be used.

A material of a substrate can be selected from glass, plastic, ceramic, a semiconductor material, a metal material whose surface is subjected to insulating treatment, and the like as appropriate. A stacked-layer substrate in which a plurality of materials for the substrate are stacked can also be used. Further, a circuit which drives the light-emitting element and includes a resistor, a capacitor, an inductor, a diode, a transistor, and the like, may be formed over a substrate surface or in the substrate.

An uneven structure having the plurality of projections 13 is formed over the first substrate 12. Each of the plurality of projections 13 may include a bottom surface having a side in contact with the bottom surface of an adjacent projection; a plurality of side surfaces each having a certain angle greater than 0° and less than or equal to 80° with respect to the bottom surface; and a vertex 13b having a continuously curved surface (see FIG. 3A). In one embodiment of the present invention, each of the plurality of projections 13 has a three-dimensional shape like a quadrangular pyramid, the vertex 13b of each of the plurality of quadrangular pyramids has a continuously curved surface, a side surface of each of the plurality of quadrangular pyramids has an angle greater than 0° and less than or equal to 80° with respect to the bottom surface of each of the plurality of quadrangular pyramids, the bottom surface is positioned over the upper surface of the first substrate 12, and sides of quadrangles of the adjacent bottom surfaces are in contact with each other, so that the projections 13 are arranged densely without any space. The angle is formed by the side surface and the bottom surface of a quadrangular pyramid, which is the projection 13. An angle $\theta_1$ in FIG. 1B is, for example, about 60°, and an angle $\theta_2$ in FIG. 1C is, for example, about 45°.

Note that the plurality of side surfaces of the projection have a certain angle with respect to the bottom surface, whereby a film (an electrode or an EL layer) can be formed over the projection to a uniform thickness. The angle is preferably larger because a light emission area can be increased. Note that in order to secure high yield in manufacturing the uneven structure, the plurality of side surfaces of the projection each preferably have a certain angle greater than 0° and less than or equal to 80° with respect to the bottom surface.

The height from the bottom surface to the vertex 13b of the projection 13 means a length of the perpendicular from the vertex 13b to the bottom surface. The height is preferably within a range of 1 μm to 100 μm, for example. In this embodiment, the height is about 30 μm. In particular, when the height is within a range of 10 μm to 100 μm, there is an advantage that the projection 13 can be formed easily. Further, the area of the bottom surface of the projection 13 is preferably within a range of 0.1 μm$^2$ to 0.3 mm$^2$. In particular, it is preferable that the area be within a range of 30 μm$^2$ to 10000 μm$^2$ because the projection 13 can be formed easily and the above-described angle can be sufficiently large. Further, it is preferable that the vertex 13b have a curved surface with a radius of curvature of 15 μm to 450 μm because it can be formed easily.

The projection 13 is formed using, for example, a transparent thermoplastic resin, a transparent photocurable resin, a transparent thermosetting resin, or the like. The projection 13 can be formed by a nanoimprinting technique, for example.

A first electrode 14 is formed over the plurality of projections 13 and along the side surfaces and the vertexes 13b of the projections 13. A first terminal 14a and a second terminal 14b are formed over the first substrate 12. The first terminal 14a is provided on one outer side than the plurality of projections 13, and the second terminal 14b is provided on the other outer side than the plurality of projections 13. The first terminal 14a is connected to the first electrode 14, and the second terminal 14b is separated from the first electrode 14 by a partition wall 15. The first terminal 14a is formed in the same layer as the second terminal 14b.

The partition wall 15 is formed in a periphery of the first electrode 14 so as to surround the plurality of projections 13. A layer 16 containing a light-emitting organic compound is formed over the partition wall 15 and the first electrode 14 and along the side surfaces and the vertexes 13b of the plurality of projections 13.

A second electrode 17 is formed over the layer 16 containing a light-emitting organic compound, the second terminal 14b, and the partition wall 15 and along the side surfaces and the vertexes 13b of the plurality of projections 13. The second electrode 17 is electrically connected to the second terminal 14b and electrically isolated from the first terminal 14a by the partition wall 15. The layer 16 containing a light-emitting organic compound is positioned between the first electrode 14 and the second electrode 17.

The adjacent side surfaces of a quadrangular pyramid of the projection 13 are connected to each other by the continuously curved surface, as illustrated in FIG. 3A. The curved surface is positioned on a ridge 13a of the quadrangular pyramid. In other words, a structure in which two side surfaces of the quadrangular pyramid are in contact with each other with the ridge (a side surface of the continuously curved surface which connects the two side surfaces of the quadrangular pyramid) 13a by the continuously curved surface can be obtained, so that a short circuit between the first electrode 14 and the second electrode 17 on the ridge 13a can be prevented.

A structure of a light-emitting element (the first electrode 14, the second electrode 17, and the layer 16 containing a light-emitting organic compound) that can be used for a light-emitting device according to one embodiment of the present invention will be described in detail in Embodiment 5.

As a material for the partition wall 15, for example, a polyimide resin, an acrylic resin, or the like can be used. As a formation method of the partition wall 15, a screen printing method, a slit coating method, or the like can be employed. Further, an inorganic insulating material such as silicon oxide ($SiO_x$) can be used.

A second substrate 18 is provided above the first substrate 12. The projections 13, the first electrode 14, the partition wall 15, the layer 16 containing a light-emitting organic compound, and the second electrode 17, which are positioned between the first substrate 12 and the second substrate 18, are sealed with a sealant 19. The sealant 19 is positioned over the first terminal 14a and the second terminal 14b. One end of the first terminal 14a and one end of the second terminal 14b are positioned on the outer side than the sealant 19.

For the sealant 19, for example, a photocurable resin (e.g., an ultraviolet (UV) curable resin such as an epoxy resin) or a glass frit material can be used. As a formation method of the sealant 19, for example, a dispensing method, a screen printing method, or a slit coating method can be employed.

In the case where an opaque substrate is used as the first substrate 12, a transparent or translucent substrate can be used as the second substrate 18.

According to this embodiment, each of the quadrangular pyramids, which are the plurality of projections 13, has a plurality of side surfaces each having a certain angle greater than 0° and less than or equal to 80° with respect to the bottom surface, whereby the layer 16 containing a light-emitting organic compound, which is formed from the direction perpendicular to the bottom surface, can be formed over the first electrode 14 to a uniform thickness. Further, each of the plurality of quadrangular pyramids has a bottom surface having a side in contact with the bottom surface of an adjacent quadrangular pyramid, whereby as many quadrangular pyramids as possible can be provided, and as many side surfaces of the quadrangular pyramids as possible can be provided, so that an area from which light is emitted uniformly can be increased. Further, the area of a region between the projections which is a region from which light is not emitted or a region having low emission intensity is reduced, whereby a light-emitting device which emits bright light uniformly can be provided. Further, the vertex 13b of the quadrangular pyramid has a continuously curved surface, so that a highly reliable light-emitting device in which a short circuit between the first electrode 14 and the second electrode 17 is unlikely to occur can be manufactured with high yield.

Further, the total area of four side surfaces of the quadrangular pyramid which is the projection 13, and the continuously curved surfaces positioned on the ridges 13a is larger than the area of the side surface of a circular cone which is provided on an inner side than the bottom surface of the quadrangular pyramid and whose bottom surface is a circle in contact with the sides of the bottom surface of the quadrangular pyramid (i.e., a circular cone of a projection having a circular bottom surface, which is illustrated in FIG. 3C). Thus, the quadrangular pyramids can be arranged without any space in a limited projected area (i.e., the area of the first substrate 12 provided with the plurality of quadrangular pyramids), and the light emission area of the quadrangular pyramids can be larger than that of the circular cones.

[Embodiment 2]

A light-emitting device according to one embodiment of the present invention will be described with reference to FIGS. 2A and 2B and FIG. 3B. Note that the same portions as those in FIGS. 1A to 1C are denoted by the same reference numerals and the description thereof is omitted.

The light-emitting device illustrated in FIGS. 2A and 2B is different from the light-emitting device illustrated in FIGS. 1A to 1C in that it has a projection 20 of a hexagonal pyramid instead of the projection 13 of the quadrangular pyramid in FIGS. 1A to 1C; however, the other components are similar to the light-emitting device illustrated in FIGS. 1A to 1C.

Specifically, as illustrated in FIGS. 2A and 2B, each of the plurality of projections 20 has a three-dimensional shape like a hexagonal pyramid, a vertex 20b of each of the plurality of hexagonal pyramids (see FIG. 3B) has a continuously curved surface, a side surface of each of the plurality of hexagonal pyramids has an angle greater than 0° and less than or equal to 80° with respect to the bottom surface of each of the plurality of hexagonal pyramids, the bottom surface is positioned over the upper surface of the first substrate 12 and, sides of hexagons of the adjacent bottom surfaces are in contact with each other, so that the projections 20 are arranged densely without any space. The angle is formed by the side surface and the bottom, surface of the hexagonal pyramid which is the projection 20. The angle $\theta_1$ in FIG. 2B is, for example, about 60°.

The height from the bottom surface to the vertex 20b of the projection 20 is preferably in a range of 1 μm to 100 μm, for example. In this embodiment, the height is about 30 μm.

Advantageous effects similar to those of Embodiment 1 can also be obtained in this embodiment.

Further, according to this embodiment, the bottom surface of the projection 20 has a hexagonal shape; therefore, the hexagonal pyramids can be provided in a limited projected area (i.e., the area of the first substrate 12 provided with the plurality of hexagonal pyramids) without any space, so that more hexagonal pyramids can be provided. Further, a structure in which two side surfaces of the hexagonal pyramid are in contact with each other on the ridge 20a of the hexagonal pyramid (a side surface of the continuously curved surface which connects the two side surfaces of the hexagonal pyramid) at an obtuse angle can be obtained, so that a light-emitting device in which a short circuit between the first electrode 14 and the second electrode 17 on the ridge 20a is unlikely to occur can be provided.

[Embodiment 3]

A light-emitting device according to one embodiment of the present invention will be described with reference to FIG. 5A. The same portions as those in FIGS. 1A to 1C are denoted by the same reference numerals and the description thereof is omitted.

The light-emitting device illustrated in FIG. 5A is different from the light-emitting device illustrated in FIG. 1B in that an auxiliary electrode 22 is formed in addition to the components of the light-emitting device illustrated in FIG. 1B; however, the other components in FIG. 5A are the same as the components in FIG. 1B.

Specifically, the auxiliary electrode 22 is formed over the first substrate 12, and quadrangular pyramids, which are the plurality of projections 13, are formed over the auxiliary electrode 22 and the first substrate 12. The auxiliary electrode 22 is formed at the feet of the plurality of quadrangular pyramids. In other words, the auxiliary electrode 22 is provided along the perimeter of a quadrangle of the bottom surface of the quadrangular pyramid. Both ends of the auxiliary electrode 22 are covered with the quadrangular pyramids. A center portion of the auxiliary electrode 22 is not overlapped with the quadrangular pyramid. The exposed portion of the auxiliary electrode 22 is electrically connected to the first electrode 14.

Advantageous effects similar to those of Embodiment 1 can also be obtained in this embodiment.

Further, according to this embodiment, even when the surface area of the first electrode 14 provided over the projections 13 is increased and the electric resistance of the first electrode 14 is high, the effective electric resistance of the first electrode 14 can be reduced by the auxiliary electrode 22, so that uniform light emission can be obtained.

Further, the both ends of the auxiliary electrode 22 are covered with the projections 13, whereby a step at the end of the auxiliary electrode 22 can be reduced, so that a defect of a short circuit between the first electrode 14 and the second electrode 17 which is caused by the step can be prevented.

Note that in the light-emitting device described in this embodiment, the auxiliary electrode 22 is formed in addition to the components of the light-emitting device illustrated in FIG. 1B; however, the auxiliary electrode may be formed in addition to the components of the light-emitting device illustrated in FIGS. 2A and 2B.

[Embodiment 4]

A light-emitting device of one embodiment of the present invention will be described with reference to FIG. 5B. The same portions as those in FIGS. 1A to 1C are denoted by the same reference numerals and the description thereof is omitted.

Figure 5B:
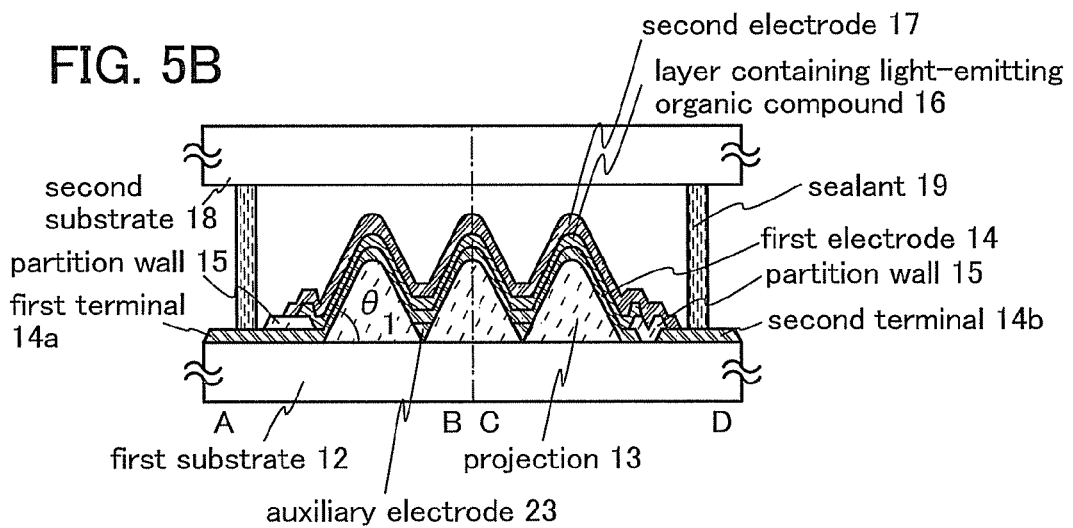
FIG. 5B is a cross-sectional view taken along line A-B and line C-D of FIG. 1A illustrating a light-emitting device of one embodiment of the present invention.

The light-emitting device illustrated in FIG. 5B is different from the light-emitting device illustrated in FIG. 1B in that an auxiliary electrode 23 is formed in addition to the components of the light-emitting device illustrated in FIG. 1B; however, the other components in FIG. 5B are the same as the components of the light-emitting device in FIG. 1B.

Specifically, the auxiliary electrode 23 is formed over quadrangular pyramids which are the plurality of projections 13, and the first electrode 14 is formed over the auxiliary electrode 23 and the projections 13. The auxiliary electrode 23 is faulted at the feet of the plurality of quadrangular pyramids and electrically connected to the first electrode 14.

Advantageous effects similar to those of Embodiment 1 can also be obtained in this embodiment.

Further, according to this embodiment, even when the surface area of the first electrode 14 provided over the projections 13 is increased and the electric resistance of the first electrode 14 is high, the effective electric resistance of the first electrode 14 can be reduced by the auxiliary electrode 23, so that uniform light emission can be obtained.

Note that in the light-emitting device described in this embodiment, the auxiliary electrode 23 is formed in addition to the components of the light-emitting device illustrated in FIG. 1B; however, the auxiliary electrode may be formed in addition to the components of the light-emitting device illustrated in FIGS. 2A and 2B.

[Embodiment 5]

In this embodiment, an example of a light-emitting element that can be used for a light-emitting device according to one embodiment of the present invention will be described with reference to FIGS. 6A and 6E.

The light-emitting element described in this embodiment as an example includes a layer containing a light-emitting organic compound (hereinafter referred to as an EL layer), between a first electrode and a second electrode. One of the first electrode and the second electrode serves as an anode and the other serves as a cathode.

STRUCTURE EXAMPLE 1 OF LIGHT-EMITTING ELEMENT

Figure 6A:
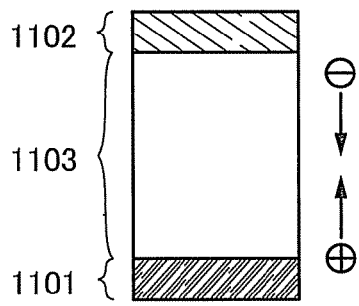
FIGS. 6A to 6E are views illustrating light-emitting elements that can be used for a light-emitting device of one embodiment of the present invention.

A structure example of the light-emitting element is illustrated in FIG. 6A. In the light-emitting element illustrated in FIG. 6A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Structure Example 1 of the light-emitting element includes one light-emitting unit.

A light-emitting unit 1103 may include at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor carrier-transport property (substance which blocks carriers), a substance having a high electron-transport property, a substance having a high electron-injection property, and a substance having a bipolar property (substance having high electron- and hole-transport properties).

Figure 6B:
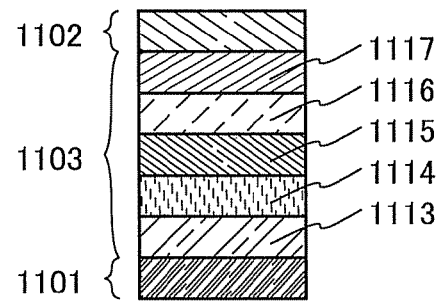

An example of a specific structure of the light-emitting unit 1103 is illustrated in FIG. 6B. In the light-emitting unit 1103 illustrated in FIG. 6B, a hole-injection layer 1113, a hole-transport layer 1114, a light-emitting layer 1115, an electron-transport layer 1116, and an electron-injection layer 1117 are stacked in this order from the anode 1101 side.

STRUCTURE EXAMPLE 2 OF LIGHT-EMITTING ELEMENT

Figure 6C:
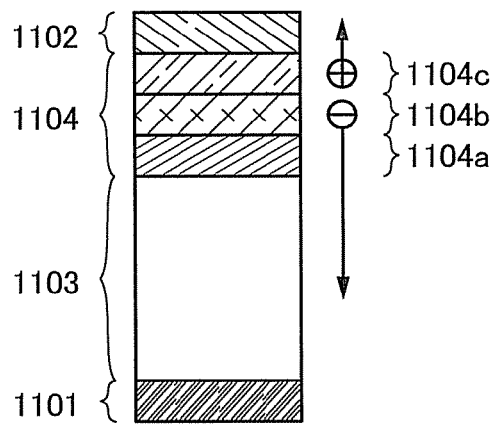

Another structure example of the light-emitting element is illustrated in FIG. 6C. In the light-emitting element illustrated in FIG. 6C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The range of choices of materials that can be used for the cathode in Structure Example 2 of the light-emitting element is wider than that of materials that can be used for the cathode in Structure Example 1 of the light-emitting element. This is because the cathode in Structure Example 2 may receive holes generated by the intermediate layer and a material having a relatively high work function can be used.

STRUCTURE EXAMPLE 3 OF LIGHT-EMITTING ELEMENT

Figure 6D:
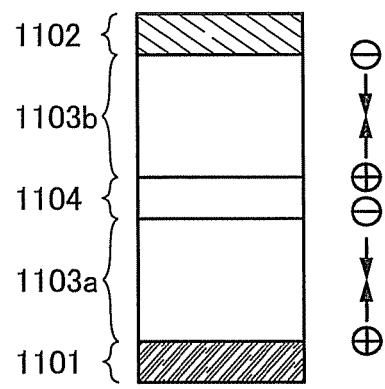
Figure 6E:
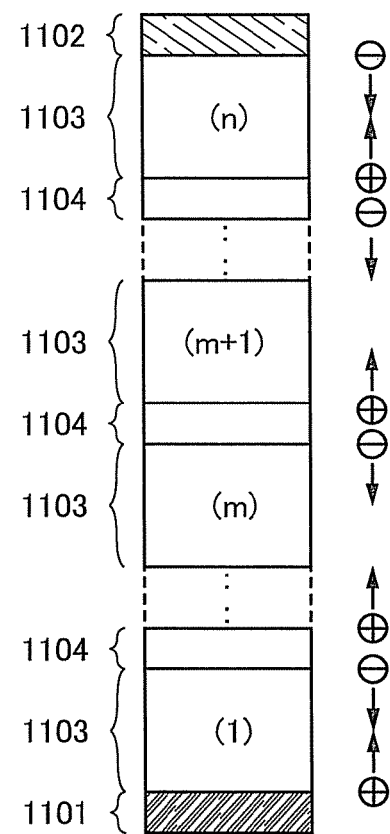

Another structure example of the light-emitting element is illustrated in FIG. 6D. In the light-emitting element illustrated in FIG. 6D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 6E has a structure in which a plurality of light-emitting units 1103 are stacked, that is, a so-called tandem structure. Note that in the case where n (n is a natural number greater than or equal to 2) light-emitting units 1103 are provided between the anode and the cathode, for example, the intermediate layer 1104 is provided between an m-th (m is a natural number greater than or equal to 1 and less than or equal to n−1) light-emitting unit and an (m+1)-th light-emitting unit. In general, the thickness of an EL layer in a tandem light-emitting element is large; therefore, a defect that a region between the projections does not emit light or a defect that the emission intensity decreases is likely to occur. However, according to one embodiment of the present invention, even when a tandem light-emitting element is used, a light-emitting device which emits light highly uniformly and has few regions which do not emit light or has low emission intensity can be realized.

Note that a structure similar to that in Structure Example 1 of the light-emitting element can be applied to the light-emitting units 1103 in Structure Example 3 of the light-emitting element; a structure similar to that in Structure Example 2 of the light-emitting element can be applied to the intermediate layer 1104 in Structure Example 3 of the light-emitting element. Thus, for the details, the description of the structure example 1 of the light-emitting element or the structure example 2 of the light-emitting element can be referred to.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, and the electrons injected into the light-emitting unit provided on the anode side are recombined with the holes injected from the anode side. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween.

Structure Examples 1 to 3 of the light-emitting element can be implemented in combination. For example, an intermediate layer may be provided between the cathode and the light-emitting unit in Structure Example 3 of the light-emitting element.

<Method for Manufacturing Light-Emitting Element>

One embodiment of a method for manufacturing a light-emitting element will be described. Over the first electrode, the layers described above are combined as appropriate to form an EL layer. Any of a variety of methods (e.g., a dry process or a wet process) can be used to form the EL layer depending on the material for the EL layer. Note that a different formation method may be employed for each layer. The second electrode is formed over the EL layer. Thus, the light-emitting element is manufactured.

The light-emitting element described in this embodiment can be fabricated by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. Note that in order to obtain white light emission, for example, a structure may be employed in which at least two light-emitting layers are provided so that light of complementary colors is emitted from the light-emitting layers. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

This embodiment can be combined with any of the other embodiments described in this specification as appropriate.

REFERENCE NUMERALS

11: light-emitting device, 12: first substrate, 13: projection, 13a: ridge (side surface of the continuously curved surface which connects the two side surfaces of the quadrangular pyramid), 13b: vertex having continuously curved surface, 14: first electrode, 14a: first terminal, 14b: second terminal, 15: partition wall, 16: layer containing light-emitting organic compound, 17: second electrode, 18: second substrate, 19: sealant, 20: projection, 20a: ridge (side surface of the continuously curved surface which connects the two side surfaces of the hexagonal pyramid), 20b: vertex having continuously curved surface, 21: projection, 22: auxiliary electrode, and 23: auxiliary electrode This application is based on Japanese Patent Application Serial No. 2011-214826 filed with Japan Patent Office on Sep. 29, 2011, the entire contents of which are hereby incorporated by reference.

The invention claimed is:

1. A light-emitting device comprising:
an auxiliary electrode over a first substrate;
a plurality of projections over the auxiliary electrode and the first substrate, wherein ends of the auxiliary electrode are covered and in contact with the plurality of projections;
a first electrode covering vertexes and side surfaces of the plurality of projections and being in contact with a portion of an upper surface of the auxiliary electrode, the portion not being covered with the plurality, of projections;
a layer comprising a light-emitting organic compound, the layer being formed along the plurality of projections and over the first electrode; and
a second electrode formed along the plurality of projections and over the layer comprising the light-emitting organic compound.

2. The light-emitting device according to claim 1, wherein each of the plurality of projections has a pyramid shape.

3. The light-emitting device according to claim 1, wherein a bottom surface of each of the plurality of projections has a quadrangular shape or a hexagonal shape.

4. The light-emitting device according to claim 1, wherein the side surfaces of the plurality of projections are connected to each other with a second continuously curved surface.

5. The light-emitting device according to claim 1, wherein the auxiliary electrode is provided along a perimeter of a bottom surface of one of the plurality of projections.

6. The light-emitting device according to claim 1, wherein the plurality of projections comprise one of a transparent thermoplastic resin, a transparent photocurable resin, and a transparent thermosetting resin.

7. The light-emitting device according to claim 1, wherein the side surfaces of the plurality of projections each have a certain angle greater than 0° and less than or equal to 80° with respect to a surface of the first substrate.

8. The light-emitting device according to claim 1, further comprising a partition wall over ends of the first electrode, the partition wall surrounding the plurality of projections over the first substrate.

9. The light-emitting device according to claim 1, further comprising a second substrate over the first substrate with a sealant interposed therebetween.

10. The light-emitting device according to claim 1, wherein the vertexes of the plurality of projections each have a first continuously curved surface with a radius of curvature of 15 μm to 450 μm.

11. A light-emitting device comprising:
a first substrate;
a plurality of projections over the first substrate;
a first electrode covering vertexes and side surfaces of the plurality of projections;
a partition wall over ends of the first electrode, the partition wall surrounding the plurality of projections over the first substrate;
a layer comprising a light-emitting organic compound, the layer being formed along the plurality of projections and over the first electrode; and
a second electrode formed along the plurality of projections and over the layer comprising the light-emitting organic compound,
wherein a height of the partition wall is lower than heights of the plurality of projections.

12. The light-emitting device according to claim 11, wherein each of the plurality of projections has a pyramid shape.

13. The light-emitting device according to claim 11, wherein a bottom surface of each of the plurality of projections has a quadrangular shape or a hexagonal shape.

14. The light-emitting device according to claim 11, wherein the side surfaces of the plurality of projections are connected to each other with a second continuously curved surface.

15. The light-emitting device according to claim 11, wherein the plurality of projections comprise one of a transparent thermoplastic resin, a transparent photocurable resin, and a transparent thermosetting resin.

16. The light-emitting device according to claim 11, wherein the side surfaces of the plurality of projections each have a certain angle greater than 0° and less than or equal to 80° with respect to a surface of the first substrate.

17. The light-emitting device according to claim 11, further comprising a second substrate over the first substrate with a sealant interposed therebetween.

18. The light-emitting device according to claim 11, wherein the vertexes of the plurality of projections each have a first continuously curved surface with a radius of curvature of 15 μm to 450 μm.

19. The light-emitting device according to claim 11, further comprising:
- a first terminal provided on one outer side than the plurality of projections; and
- a second terminal provided on the other outer side than the plurality of projections,
- wherein the first terminal is connected to the first electrode, and the second terminal is separated from the first electrode by the partition wall.

20. The light-emitting device according to claim 8, further comprising:
- a first terminal provided on one outer side than the plurality of projections; and
- a second terminal provided on the other outer side than the plurality of projections,
- wherein the first terminal is connected to the first electrode, and the second terminal is separated from the first electrode by the partition wall.

* * * * *

UNITED STATES PATENT AND TRADEMARK OFFICE
CERTIFICATE OF CORRECTION

PATENT NO. : 9,048,453 B2
APPLICATION NO. : 13/627205
DATED : June 2, 2015
INVENTOR(S) : Takuya Kawata et al.

It is certified that error appears in the above-identified patent and that said Letters Patent is hereby corrected as shown below:

In the Specification:

Column 3, Line 19; Change "is, high" to --is high--.
Column 7, Line 15; Change "bottom, surface" to --bottom surface--.
Column 8, Line 30; Change "faulted" to --formed--.

In the Claims:

Column 11, Line 55, Claim 1; Change "plurality, of" to --plurality of--.

Signed and Sealed this
Twelfth Day of April, 2016

Michelle K. Lee
*Director of the United States Patent and Trademark Office*